United States Patent [19]

Grallert

[11] Patent Number: 4,536,880
[45] Date of Patent: Aug. 20, 1985

[54] DIGITAL DPCM-CODER HAVING A HIGH PROCESSING SPEED

[75] Inventor: Hans-Joachim Grallert, Groebenzell, Fed. Rep. of Germany

[73] Assignee: Siemens Aktiengesellschaft, Berlin & Munich, Fed. Rep. of Germany

[21] Appl. No.: 523,561

[22] Filed: Aug. 16, 1983

[30] Foreign Application Priority Data

Sep. 1, 1982 [DE] Fed. Rep. of Germany ....... 3232558

[51] Int. Cl.³ ...................... H04B 12/04; H03K 13/22
[52] U.S. Cl. .................................... 375/30; 332/11 D
[58] Field of Search ........................... 375/27, 30, 33; 340/347 DD; 332/11 R, 11 D; 328/151

[56] References Cited

U.S. PATENT DOCUMENTS 4,468,790 8/1984 Höfelt ................................... 375/30
4,470,146 9/1984 Yatsuzuka et al. ..................... 375/30

OTHER PUBLICATIONS

"A Real-Time Adaptive Predictive Coder Using Small Computers", Aaron J. Goldberg, IEEE Transactions on Communications, vol. Com-23, No. 12, Dec. 1975.
"Comparison of Adaptive Linear Prediction Algorithms in ADPCM", Michael L. Honig, IEEE Transactions on Communications, vol. Com-30, No. 7, Jul. 1982.
"Principles of Pulse Code Modulation", K. W. Cattermole, ILIFFE Books, London, 1973.

Primary Examiner—Benedict V. Safourek
Attorney, Agent, or Firm—Hill, Van Santen, Steadman & Simpson

[57] ABSTRACT

In an improved digital DPCM-coder having a high calculating speed, a second quantizer is provided which is supplied with a DPCM-signal determined in a calculating loop, and which emits from its output a quantized DPCM-signal multiplied by a prediction factor. With the improved coder, one calculating operation less is required, and the coder can process a higher PCM-data rate at a constant calculating speed of the components.

3 Claims, 4 Drawing Figures

DIGITAL DPCM-CODER HAVING A HIGH PROCESSING SPEED

BACKGROUND OF THE INVENTION

The invention relates to a digital DPCM-coder having a high processing speed, with a quantizer from whose output quantized DPCM-signals are emitted. A calculating loop serves to determine an estimated value. The loop contains an adder and a multiplier in which multiplication by a prediction factor takes place, and a subtractor which precedes the input of the quantizer and whose first input is supplied with a PCM signal and whose second input is supplied with the estimated value.

FIG. 1 of the drawings illustrates a known DPCM-coder which determines the DPCM-signal in four calculating steps. The function thereof will be explained in further detail later in the description. At high transmission speeds the known construction of the DPCM-coder necessitates excessively long calculation times even when modern circuit technology is used.

SUMMARY OF THE INVENTION

An object of the invention is to provide a DPCM-coder which operates with a smaller number of consecutive calculating operations in the feedback loop.

Commencing from a DPCM-coder of the type described in the introduction, this object is realized in that a second quantizer is provided which is likewise connected to the output of the subtractor, and which at its output emits the quantized DPCM-signal multiplied by a prediction factor. The output of the second quantizer is connected to the first input of the adder, and the output of the adder connects to the second input of the subtractor and to the first input of the multiplier whose output connects to the second input of the adder.

The DPCM-coder in accordance with the invention requires only three calculating steps. The circuitry expense is only insignificantly greater. Only one second quantizer need be used.

It is advantageous to provide one single quantizer which possesses two outputs in place of two quantizers.

When integrated circuit technology is used it is expedient to provide the two quantizers with a common construction.

For cost reasons it is advantageous to replace the first quantizer by a second multiplier which is connected to the output of the second quantizer, wherein the second multiplier effects a multiplication by the inverse value 1/A of the prediction factor.

In this version of the circuit the first quantizer is replaced since the quantized DPCM-signal is calculated by means of a second multiplier.

It is expedient to provide a freely addressable memory by way of a quantizer.

It is expedient to use a ROM, PROM or an EPROM as a memory. It is also suitable to use a RAM into which the quantized DPCM-values have been previously input. The quantization is carried out in a particularly simple way. The DPCM-signal calculated in the subtractor occurs by way of an address in, for example, a ROM. Consequently the quantized DPCM-signal is generally read out with a smaller number of binary digits. Thus the quantization takes place by determining the data in the ROM.

DESCRIPTION OF THE PREFERRED EMBODIMENTS

Figure 1:
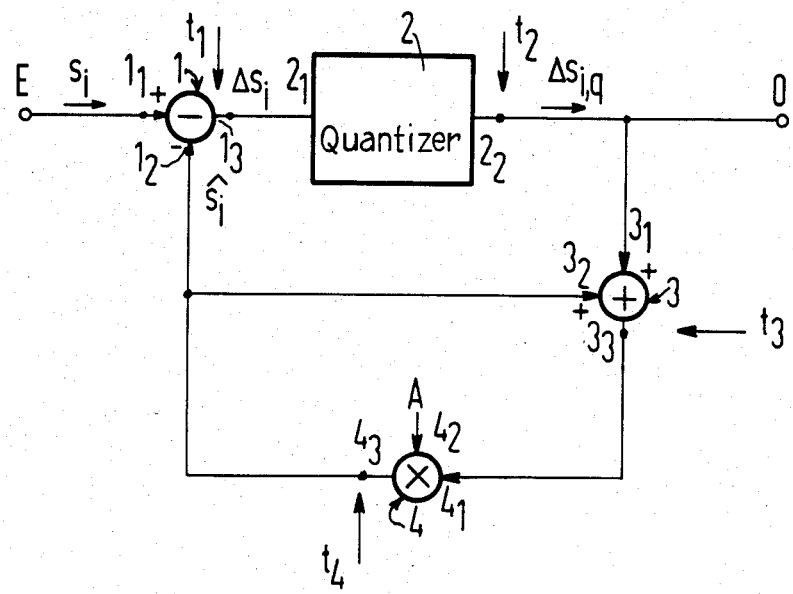
FIG. 1 illustrates a known prior art DPCM-coder.

The DPCM-coder illustrated in FIG. 1 contains a subtractor 1 whose input $1_1$ represents the input E of the circuit arrangement. The output $1_3$ of the subtractor 1 is connected to the input $2_1$ of the quantizer 2 whose output $2_2$ represents the output 0 of the DPCM-coder from which the quantized DPCM-signal $\Delta s_{i,q}$ is emitted. The output of the quantizer 2 is connected to a first input $3_1$ of an adder 3 whose output $3_3$ is connected to the first input $4_1$ of a multiplier 4 whose output $4_3$ is connected to the second input $1_2$ of the subtractor and to the second input $3_2$ of the adder 3. The second input $4_2$ of the multiplier is supplied with a constant prediction factor $A \leq 1$. The input of the circuit is supplied with PCM-signal values $s_i$. The time sequence of the signal is characterized by the index "$i$".

The mode of operation of the DPCM-coder consists in calculating an estimated value $s_i$ on the basis of preceding sample values. From the difference between the occurring PCM-signal value $s_i$ and the estimated value $s_i$ the difference $\Delta s_i$ is calculated which is first quantized and then transmitted. This quantized DPCM-signal value is referenced $\Delta s_{i,q}$. The time flow of the calculation of a DPCM-signal value consists of four steps:

(1) up until time $t_1$: calculation of $\Delta s_i = s_i - s_i$, (2) up until time $t_2$: quantization of $\Delta s_i \to \Delta s_{i,q}$, (3) up until time $t_3$: addition of $s_i + \Delta s_{i,q}$, (4) up until time $t_4$: multiplication of $A \cdot (s_i + \Delta s_{i,q}) = s_{i+1}$.

The DPCM-coder has been illustrated purely schematically. Here it has been assumed that the output signal of the circuit element occurs at each of the times $t_1$ to $t_4$. This can be effected by the selection of suitable modules or by means of additional transit time elements or suitable intermediate stores (bistable flip-flops).

The DPCM-coder in accordance with the invention (FIG. 2) likewise contains a subtractor 1 whose output $1_3$ is connected to the input $2_1$ of the quantizer 2 whose output $2_2$ represents the output 0 of the DPCM-coder. A second quantizer 5 is likewise connected by its input $5_1$ to the output $1_3$ of the subtractor. The output $5_2$ of the second quantizer 5 is connected to the first input $3_1$ of the adder 3 whose output $3_3$ is connected to the second input $1_2$ of the subtractor 1.

The signal which occurs at the input $1_2$ is subtracted from the PCM-signal value $s_i$ occurring at the input E. Via the multiplier 4 the output $3_3$ of the adder 3 is connected to its second input $3_2$. In certain embodiments it is necessary to connect a transit time element 6 following the multiplier 4. On the basis of the preceding considerations the estimated value is calculated as follows:

$$s_{i+1} = A(s_i + s_{i,q}) = A \cdot s_i + A \Delta s_{i,q}.$$

If the evaluation with the prediction factor A is carried out separately for $s_i$ and $\Delta s_{i,q}$, some of the calculating operations can run in parallel in the DPCM-coder. This is achieved by means of the second quantizer 5 whose output has already emitted the quantized DPCM-signal $\Delta s_{i,q}$ multiplied by the prediction factor A.

The time sequence for the calculation of $s_{i+1}$ can now be divided into three time intervals:

(1) up until time $t_1$: calculation of $\Delta s_i = s_i - s_i$ and $A \cdot s_i$,
(2) up until time $t_2$: determination of $\Delta s_{i,q}$ and $A \cdot \Delta s_{i,q}$,
(3) up until time $t_3$: addition of $A \cdot \Delta s_{i,q} + A \cdot s_i = s_{i+1}$.

Figure 2:
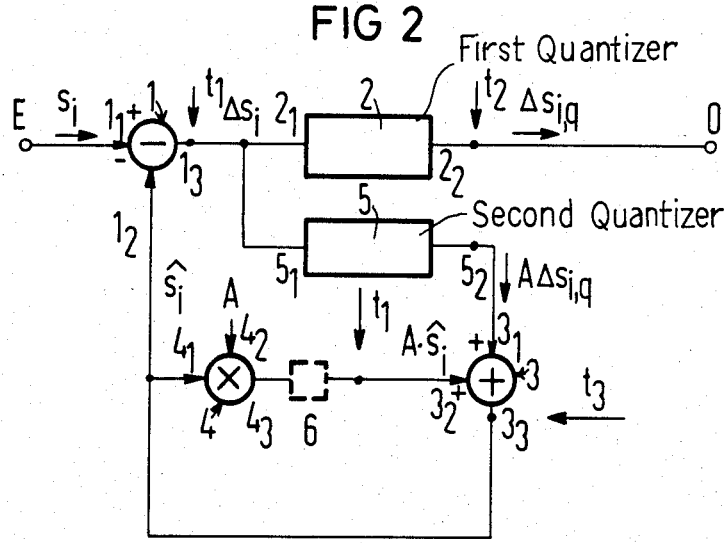
FIG. 2 illustrates a DPCM-coder in accordance with the present invention.

FIG. 2 represents the calculated values following the time $t_2$. With the assistance of this circuit arrangement only three consecutive calculating operations are required. Consequently the time available with respect to each calculating operation is increased or it is possible to process a more rapid sequence of PCM-signal values $s_i$.

Figure 3:
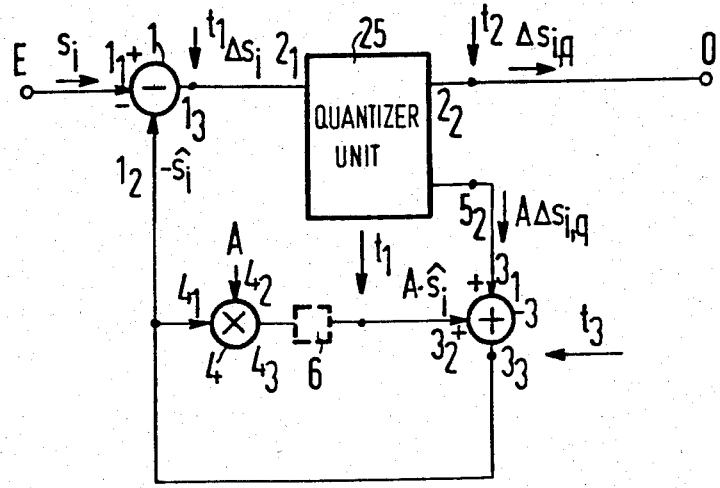
FIG. 3 illustrates an alternate embodiment of the DPCM-coder of FIG. 2.

FIG. 3 illustrates the decoder of FIG. 2 but with the previous mentioned alternate embodiment wherein the two quantizers have a common construction as shown in FIG. 3 at 25.

Figure 4:
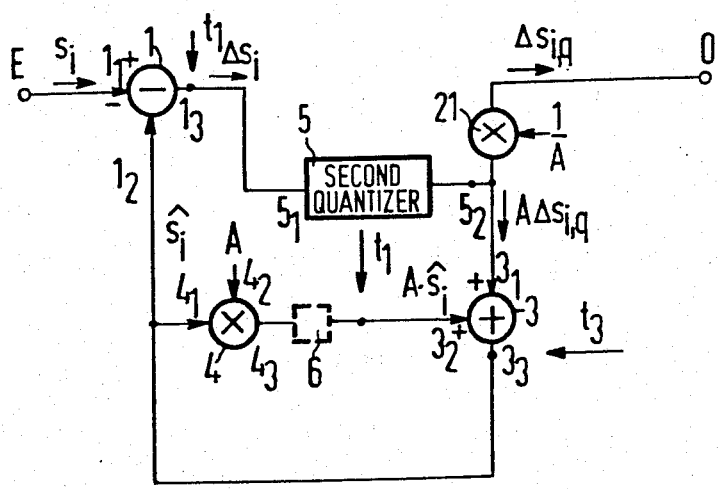
FIG. 4 illustrates another alternate embodiment of the DPCM-coder of FIG. 2.

FIG. 4 shows the alternate embodiment as previously described wherein the first quantizer is replaced by a second multiplier connected to the output of the second quantizer, and wherein the second multiplier causes a multiplication by the inverse value 1/A of the prediction factor. The second multiplier is shown at 21 in FIG. 4.

In the case of this circuit arrangement ROMs are used as quantizers. It is also possible to use PROMs and RAMs. The quantization takes place automatically by reading out the stored data with the aid of the DPCM-signal $\Delta s_i$ present at the input of the quantizers. The adders and multipliers can consist of commercially available modules, for example type SN 54 LS181 as adder and subtractor and module SN 54 LS261 as a multiplier. These modules are manufactured by Texas Instruments.

Although modifications and changes may be suggested by those skilled in the art it is the intention of the inventor to embody within the patent warranted hereon all changes and modifications as reasonably and properly come within the scope of his contribution to the art.

I claim as my invention:

1. A digital DPCM-coder having a high processing speed with fewer calculating operations, comprising:
    an adder having first and second inputs and an output;
    a subtractor having first and second inputs and an output;
    a multiplier means having an input and an output;
    a first quantizer means having an input and an output;
    a second quantizer means having an input and an output;
    a PCM signal input connecting to the first input of the subtractor;
    the output of the subtractor being connected to the input of the first quantizer means, said first quantizer means outputting quantized DPCM-signals;
    a calculating loop means connected between the output of the subtractor and the second input of the subtractor, said calculating loop means determining an estimated value which is fed to said subtractor second input; and
    said calculator loop means comprising the second quantizer means whose output is connected to the first input of the adder, the output of the adder connecting to the input of the multiplier means which multiplies with a prediciton factor A, the output of the multiplier means connecting to the second input of the adder, and the output of the adder connecting to the second input of the subtractor.

2. A digital DPCM-coder having a high processing speed with fewer calculating operations, comprising:
    an adder having first and second inputs and an output;
    a subtractor having first and second inputs and an output;
    a multiplier means having an input and an output;
    a quantizer unit containing first and second quantizer means;
    the first quantizer means having an input and output;
    the second quantizer means having the same input as the first quantizer means and an output;
    a PCM signal input connecting to the first input of the subtractor;
    the output of the subtractor being connected to the input of the first and second quantizer means, said first quantizer means outputting quantized DPCM-signals;
    a calculating loop means connected between the output of the subtractor and the second input of the subtractor, said calculating loop means determining an estimated value which is fed to said subtractor second input; and
    said calculator loop means comprising the second quantizer means whose output is connected to the first input of the adder, the output of the adder connecting to the first input of the multiplier means which multiplies with a prediction factor A, the output of the multiplier means connecting to the second input of the adder, and the output of the adder connecting to the second input of the subtractor.

3. A digital DPCM-coder having a high processing speed with fewer calculating operations, comprising:
    an adder having first and second inputs and an output;
    a subtractor having first and second inputs and an output;
    a first multiplier means having an input and an output;
    a second multiplier means having an input and output;
    a quantizer means having an input and output;
    a PCM signal input connecting to the first input of the subtractor;
    the output of the subtractor being connected to the input of the first multiplier means, said first multiplier means outputting quantized DPCM-signals;
    a calculating loop means connected between the output of the subtractor and the second input of the subtractor, said calculating loop means determining an estimated value which is fed to said subtractor second input; and
    said calculator loop means comprising the second quantizer means whose output is connected to the first input of the adder, the output of the adder connecting to the input of the first multiplier means which multiplies with a prediction factor A, the output of the first multiplier means connecting to the second input of the adder, the output of the adder connecting to the second input of the subtractor, and the second multiplier means multiplying by an inverse value 1/A of the prediction factor A.

* * * * *